(12) United States Patent
Fan

(10) Patent No.: US 12,191,271 B2
(45) Date of Patent: Jan. 7, 2025

(54) SEMICONDUCTOR STRUCTURE COMPRISING UP-NARROW AND DOWN-WIDE OPENINGS AND FORMING METHOD THEREOF

(71) Applicant: CHANGXIN MEMORY TECHNOLOGIES, INC., Hefei (CN)

(72) Inventor: Zengyan Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 315 days.

(21) Appl. No.: 17/661,375

(22) Filed: Apr. 29, 2022

(65) Prior Publication Data

US 2023/0223369 A1 Jul. 13, 2023

Related U.S. Application Data

(63) Continuation of application No. PCT/CN2022/080867, filed on Mar. 15, 2022.

(30) Foreign Application Priority Data

Jan. 7, 2022 (CN) .......................... 202210016726.9

(51) Int. Cl.
H01L 23/00 (2006.01)

(52) U.S. Cl.
CPC .............. *H01L 24/14* (2013.01); *H01L 24/03* (2013.01); *H01L 24/06* (2013.01); *H01L 24/11* (2013.01);

(Continued)

(58) Field of Classification Search
CPC .......... H01L 24/14; H01L 24/81; H01L 24/13; H01L 24/05; H01L 24/06; H01L 2224/03005; H01L 24/03; H01L 24/11

(Continued)

(56) References Cited

U.S. PATENT DOCUMENTS

| 10,276,465 | B2 | 4/2019 | Tsai |
| 2009/0140420 | A1 | 6/2009 | Farooq et al. |

(Continued)

FOREIGN PATENT DOCUMENTS

| CN | 107887348 A | 4/2018 |
| CN | 112154537 A | 12/2020 |

(Continued)

OTHER PUBLICATIONS

International Search Report cited in PCT/CN2022/080867 mailed Sep. 28, 2022, 9 pages.

*Primary Examiner* — Didarul A Mazumder
(74) *Attorney, Agent, or Firm* — Syncoda LLC; Feng Ma

(57) ABSTRACT

The present application provides a semiconductor structure and a forming method thereof. The method of forming the semiconductor structure includes: providing a semiconductor chip and a substrate; forming, on the substrate, a first covering film covering a metal pad and a surface of the substrate, a plurality of up-narrow and down-wide openings being formed in the first covering film, and a bottom of each of the up-narrow and down-wide openings correspondingly exposing a surface of the metal pad; and flipping the semiconductor chip onto the substrate, such that a solder bump on a metal pillar is correspondingly located in the up-narrow and down-wide opening, and the solder bump fill the up-narrow and down-wide opening.

20 Claims, 4 Drawing Sheets

(52) U.S. Cl.
CPC ............... *H01L 2224/03005* (2013.01); *H01L 2224/0612* (2013.01); *H01L 2224/1162* (2013.01); *H01L 2224/14104* (2013.01)

(58) Field of Classification Search
USPC .......................................... 257/737; 438/613
See application file for complete search history.

(56) References Cited

U.S. PATENT DOCUMENTS

| | | |
|---|---|---|
| 2010/0164098 A1 | 7/2010 | Kuechenmeister et al. |
| 2013/0069231 A1* | 3/2013 | Shen ..................... H01L 24/13 |
| | | 257/738 |
| 2013/0299961 A1* | 11/2013 | Chen ................. H01L 23/49827 |
| | | 257/706 |
| 2015/0021762 A1* | 1/2015 | Williamson ...... H01L 23/49838 |
| | | 257/737 |
| 2016/0276174 A1* | 9/2016 | Kim .................... H01L 23/5389 |
| 2016/0342018 A1* | 11/2016 | Xue ...................... G03F 7/0007 |
| 2020/0098592 A1* | 3/2020 | Okamoto ............ H01L 21/6835 |
| 2021/0313290 A1 | 10/2021 | Kyung et al. |
| 2022/0238480 A1* | 7/2022 | Zhan ..................... H01L 24/16 |

FOREIGN PATENT DOCUMENTS

| | | |
|---|---|---|
| JP | 2021093412 A | 6/2021 |
| WO | 2011052746 A1 | 5/2011 |

* cited by examiner

SEMICONDUCTOR STRUCTURE COMPRISING UP-NARROW AND DOWN-WIDE OPENINGS AND FORMING METHOD THEREOF

CROSS-REFERENCE TO RELATED APPLICATIONS

This is a continuation of International Application No. PCT/CN2022/080867, filed on Mar. 15, 2022, which claims the priority to Chinese Patent Application No. 202210016726.9, titled "SEMICONDUCTOR STRUCTURE AND FORMING METHOD THEREOF" and filed with China National Intellectual Property Administration (CNIPA) on Jan. 7, 2022. The entire contents of International Application No. PCT/CN2022/080867 and Chinese Patent Application No. 202210016726.9 are incorporated herein by reference.

TECHNICAL FIELD

The present application relates to the field of semiconductors, and in particular to a semiconductor structure and a forming method thereof.

BACKGROUND

With the more powerful functions, better performance and higher integration of integrated circuits (ICs), and with the advent of novel ICs, packaging technologies are playing an increasingly more important role in the ICs and are more valuable to whole electronic systems. Moreover, while feature sizes of the ICs reach the nanoscale, transistors are developing toward a higher density and a higher clock frequency, and a higher packaging density is emerging. Due to the higher packaging density, it is challenging to implement the fine-pitch electrical interconnection between chips or between the chip and the package substrate and its reliability.

The copper pillar bump flip-chip interconnection with good electrical performance and resistance to electromigration is becoming a key to the fine-pitch interconnection for a next generation of chips. According to the copper pillar bump flip-chip interconnection, a semiconductor chip provided with copper pillars and solder bumps is flipped onto a substrate, and through the solder bumps, the semiconductor chip is connected to the substrate.

However, during the flip-chip bonding of the copper pillar bump flip-chip interconnection, the semiconductor chip is prone to inclination or misalignment to cause the poor bonding.

SUMMARY

In view of this, an embodiment of the present application provides a method of forming a semiconductor structure, including:
providing a semiconductor chip, a plurality of protruded metal pillars and a solder bump on a top surface of each of the metal pillars being formed on the semiconductor chip;
providing a substrate, a plurality of metal pads being formed on a surface of the substrate;
forming, on the substrate, a first covering film covering the metal pads and the surface of the substrate, a plurality of up-narrow and down-wide openings being formed in the first covering film, and a bottom of each of the up-narrow and down-wide openings correspondingly exposing a surface of the metal pad; and
flipping the semiconductor chip onto the substrate, such that the solder bump on each of the metal pillars is correspondingly located in an up-narrow and down-wide opening, and the solder bump fill the up-narrow and down-wide opening.

An embodiment of the present application further provides a semiconductor structure, including:
a semiconductor chip, a plurality of protruded metal pillars and solder bumps on top surface of each of the metal pillars being formed on the semiconductor chip;
a substrate, a plurality of metal pads being formed on a surface of the substrate; and
a first covering film located on the substrate and covering the metal pad and the surface of the substrate, a plurality of up-narrow and down-wide openings being formed in the first covering film, and a bottom of each of the up-narrow and down-wide openings correspondingly exposing a surface of the metal pad, wherein
the semiconductor chip is flipped onto the substrate, such that the solder bump on each of the metal pillars is correspondingly located in the up-narrow and down-wide opening, and fill the up-narrow and down-wide opening.

DETAILED DESCRIPTION

As described in the background art, during the flip-chip bonding, the semiconductor chip is prone to inclination or misalignment to cause the poor bonding.

According to the research, the existing semiconductor chip is usually flipped onto the substrate with thermo compression bonding, and during the thermo compression bonding, the semiconductor chip is inclined or misaligned for the deviated thermal pressure or non-uniform pressure distribution to cause the poor bonding.

In view of this, the present application provides a semiconductor structure and a forming method thereof. The present application can prevent misalignment or inclination of the semiconductor chip when the semiconductor chip is flipped onto the substrate, and thus prevent poor bonding.

To make the above objectives, features and advantages of the present application clearer, specific implementations of the present application will be described below in detail with reference to accompanying drawings. In detailed descriptions on embodiments of the present application, schematic views are not partially enlarged according to a general proportion for ease of descriptions. The schematic views merely serve as examples, rather than limitations to the scope of protection of the present application. In addition, dimensions in a three-dimensional (3D) space including a length, width and depth shall be provided in actual manufacture.

Figure 1:
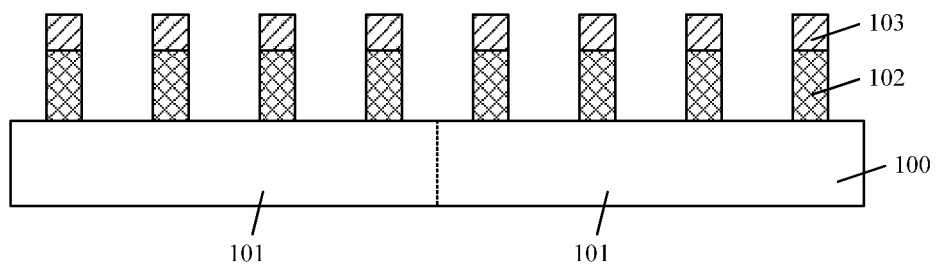
FIG. 1 to FIG. 13 each are a schematic structural view in a method of forming a semiconductor structure according to an embodiment of the present application.

Referring to FIG. 1, a wafer 100 is provided. A plurality of semiconductor chips 101 are formed on the wafer 100. A plurality of metal pillars 102 and solder bumps 103 on top surfaces of the metal pillars 102 are formed on each of the semiconductor chips 101.

The wafer 100 includes a plurality of chip regions arranged in rows and columns, and scribe lane regions located between the chip regions. A plurality of semiconductor chips 101 are formed in the chip regions. The wafer 100 may be made of monocrystalline silicon (Si), monocrystalline germanium (Ge), silicon-germanium (GeSi) or silicon carbide (SiC); or may also be made of silicon on insulator (SOI) or germanium on insulator (GOI); or may further be made of another material such as gallium arsenide or other III-V compounds.

The semiconductor chips 101 each are provided therein with an IC (not shown in the figure). A plurality of pads (not shown in the figure) are provided on a surface of each of the semiconductor chips 101. The pads on the surface of each of the semiconductor chips 101 are electrically connected to the IC in each of the semiconductor chips. The metal pillars 102 are correspondingly formed on the pads. The solder bumps 103 are formed on the top surfaces of the metal pillars 102.

The metal pillars 102 are made of aluminum, nickel, tungsten, platinum, copper, titanium, chromium, tantalum, tin alloy, gold or silver. The solder bumps 103 are made of tin or tin alloy. The tin alloy may be one or more of tin-silver, tin-lead, tin-silver-copper, tin-silver-zinc, tin-zinc, tin-bismuth-indium, tin-indium, tin-gold, tin-copper, tin-zinc-indium or tin-silver-antimony.

In some embodiments, a process for forming the metal pillars 102 and the solder bumps 103 includes: A passivation layer covering a surface of the wafer 100 is formed, openings exposing parts of surfaces of pads on the semiconductor chip 101 being formed in the passivation layer. Under bump metal (UBM) layers are formed on a surface of the passivation layer as well as on sidewalls and bottom surfaces of the openings, the UBM layers serving as conductive layers and seed layers in subsequent electroplating for formation of the metal pillars. Mask layers (such as photoresist layers) are formed on the UBM layers, openings exposing parts of surfaces of the UBM layers on the pads being formed in the mask layers. Metal is filled in the openings with electroplating to form the metal pillars 102. The solder bumps 103 are formed on surfaces of the metal pillars 102 with screen printing. The mask layers are removed.

The solder bumps 103 formed are not reflowed to keep original shapes of the solder bumps 103. The solder bumps 103 are square bumps.

Figure 2:
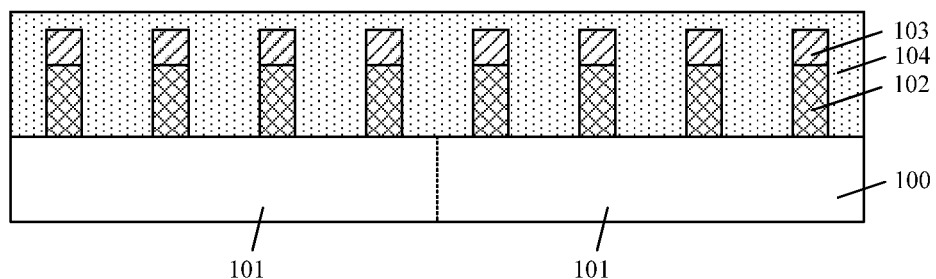

Referring to FIG. 2, a second covering film 104 covering the plurality of protruded metal pillars 102 and the solder bumps 103 on the top surfaces of the metal pillars are formed on the wafer 100.

The second covering film 104 isolates and protects the metal pillars 102.

In some embodiments, the second covering film 104 is made of an NCF. The NCF includes Si and an epoxy resin material.

In other embodiments, the second covering film 104 may be made of other resin materials.

Figure 3:
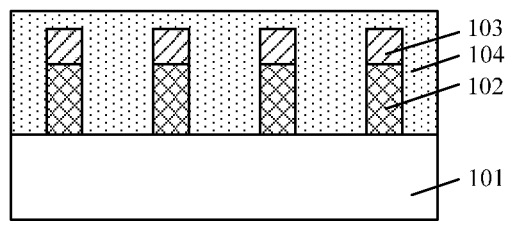

Referring to FIG. 3, the wafer 100 (referring to FIG. 2) is diced to form a plurality of discrete semiconductor chips 101.

On a surface of each of the semiconductor chips 101, there are a plurality of protruded metal pillars 102 and solder bumps 103 on top surfaces of the metal pillars 102, as well as a second covering film 104 covering the plurality of metal pillars 102 and the solder bumps 103.

Figure 5:
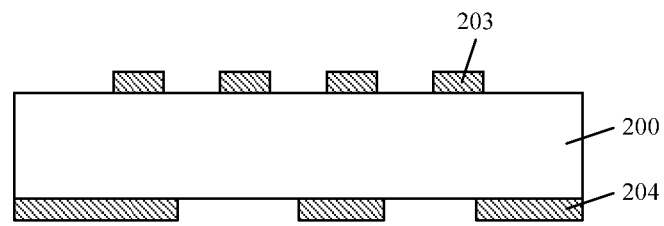

Referring to FIG. 5, a substrate 200 is provided, a plurality of metal pads 203 being formed on a surface of the substrate 200.

In some embodiments, the package substrate 200 is a resin substrate, a ceramic substrate, a glass substrate, a silicon substrate, a metal substrate, a metal frame or an alloy frame. The substrate 200 may be a single-layer plate or a multilayer plate.

In some embodiments, the substrate 200 includes a front side and a back side opposite to the front side. The plurality of metal pads 203 are formed on the front side of the substrate 200. The metal pads 203 are subsequently connected to the solder bumps 103 on the semiconductor chip 101 (referring to FIG. 3). A plurality of external pads 204 are formed on the back side of the substrate 200. The plurality of external pads 204 may be configured to connect other semiconductor chips. The metal pads 203 on the front side of the substrate 200 may be connected to the external pads 204 on the back side of the substrate 200 through a metal connecting structure in the substrate 200 and/or on the surface of the substrate.

Figure 4:
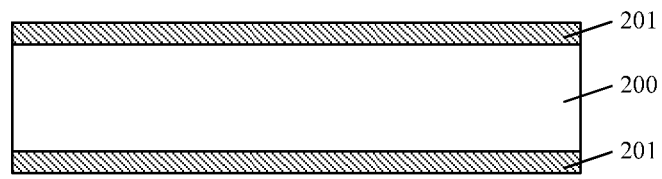

In some embodiments, a process for forming the metal pads 203 and the external pads 204 includes: Referring to FIG. 4, metal layers 201 are formed on the front side and the back side of the substrate 200. The metal layers 201 may be made of one or more of W, Al, Cu, Ti, Ag, Au, Pt and Ni. The metal layers 201 may be formed by sputtering, sputtering coating, electroplating, evaporation, etc. The metal layers 201 are formed on surfaces of the front side and the back side of the substrate 200. Dry films are formed on surfaces of the metal layers on the front side and the back side of the substrate 200. The dry films are photosensitive films and may be formed by lamination. The dry films are exposed and developed, such that first openings exposing a part of the surface of the metal layer on the front side of the substrate 200 are formed in the dry film on the front side, and second openings exposing a part of the surface of the metal layer on the back side of the substrate 200 are formed in the dry film on the back side. The exposed metal layers are removed by etching along the first openings and the second openings, thus forming the plurality of metal pads 203 on the front side of the substrate 200 and the plurality of external pads 204 (referring to FIG. 5) on the back side of the substrate 200. The dry films are removed.

Figure 8:
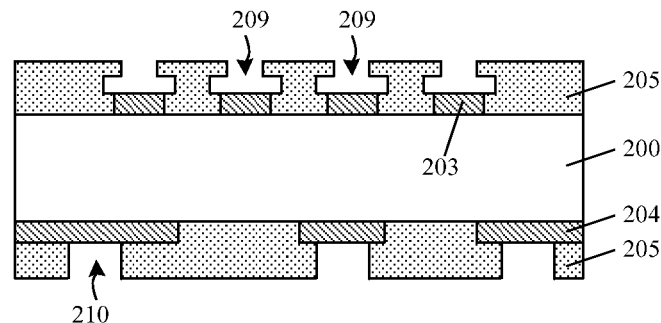

Referring to FIG. 8, a first covering film 205 covering the metal pads 203 and the surface of the substrate 200 is formed on the substrate 200, a plurality of up-narrow and down-wide openings 209 being formed in the first covering film 205, and bottoms of the up-narrow and down-wide openings 209 correspondingly exposing surfaces of the metal pads 203.

In some embodiments, the first covering film 205 may be formed on the front side and the back side of the substrate 200. A plurality of up-narrow and down-wide openings 209 are formed in the first covering film 205 on the front side of the substrate 200. Bottoms of the up-narrow and down-wide openings 209 correspondingly expose surfaces of the metal pads 203. Second openings 210 exposing parts of surfaces of the external pads 204 may be formed in the first covering film 205 on the back side of the substrate 200.

The plurality of up-narrow and down-wide openings 209 in the first covering film 205 have the following functions: When the semiconductor chip 101 (referring to FIG. 3) is subsequently flipped onto the substrate 200, the solder bumps 103 on the metal pillars 102 of the semiconductor chip 101 are correspondingly stretched into the up-narrow and down-wide openings 209. As the up-narrow and down-wide openings 209 limit the positions of the solder bumps 103, the solder bumps 103 are bonded with the metal pads 203 more firmly, thus preventing misalignment or inclination of the semiconductor chip and preventing the poor bonding. In addition, owing to the up-narrow and down-wide openings 209, the solder bumps 103 molten are limited within the up-narrow and down-wide openings 209, for fear of a short circuit between adjacent metal pillars 102 due to solder overflow.

In some embodiments, the up-narrow and down-wide openings 209 each may include a first opening and a second opening that communicate with each other, the second opening is located on the first opening, and the second opening is narrower than the first opening.

Figure 6:
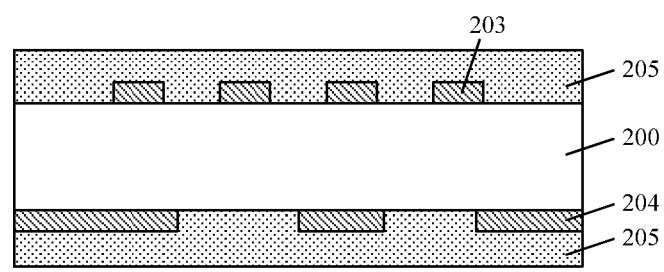
Figure 7:
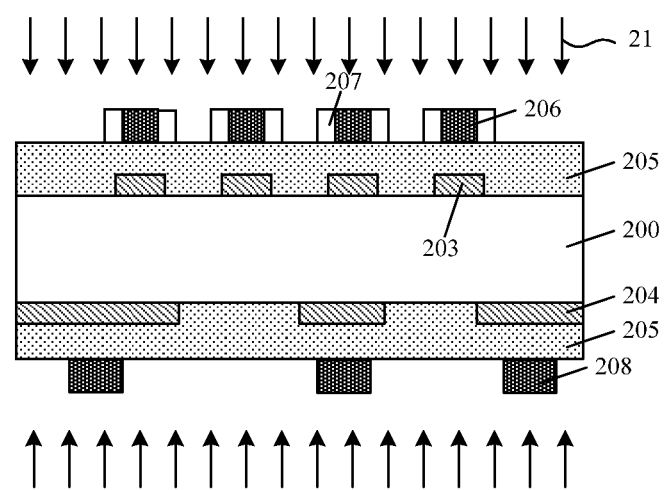

In the embodiment, the first covering film 205 is a negative photoresist film. Referring to FIGS. 6-8, a process for forming the up-narrow and down-wide openings 209 includes: Referring to FIG. 6, the negative photoresist film 205 covering the metal pads 203 and the surface of the substrate 200 is formed on the substrate 200. In some embodiments, the negative photoresist film 205 may be formed by lamination.

Referring to FIG. 7, exposure 21 is performed on the negative photoresist film 205. During the exposure, the negative photoresist film 205 directly over the metal pads 203 is not exposed (the negative photoresist film 205 is shielded by an opaque photomask pattern 206), the negative photoresist film 205 over peripheral edge regions of the metal pads 203 is half exposed (the negative photoresist film 205 is shielded by a semi-transparent photomask pattern 207. During the half exposure, only a part of the negative photoresist film 205 close to the surface is exposed), and the remaining negative photoresist film 205 is fully exposed (there no region shielded by the photomask pattern).

Referring to FIG. 8, the negative photoresist film 205 is developed upon the exposure, the unexposed negative photoresist film is removed, and the up-narrow and down-wide openings 209 are formed in the remaining negative photoresist film 205.

The up-narrow and down-wide openings 209 are formed simply with the above method.

Figure 9:
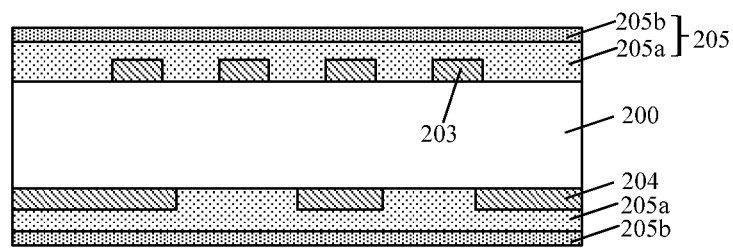
Figure 10:
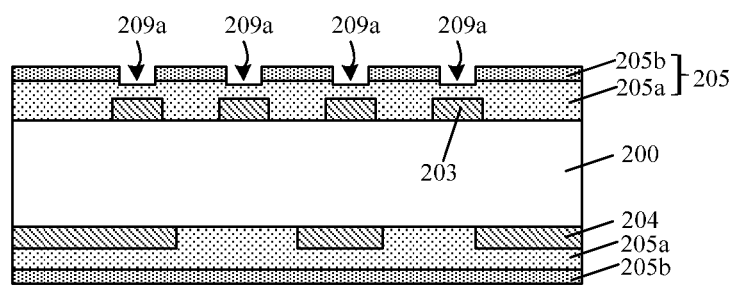
Figure 11:
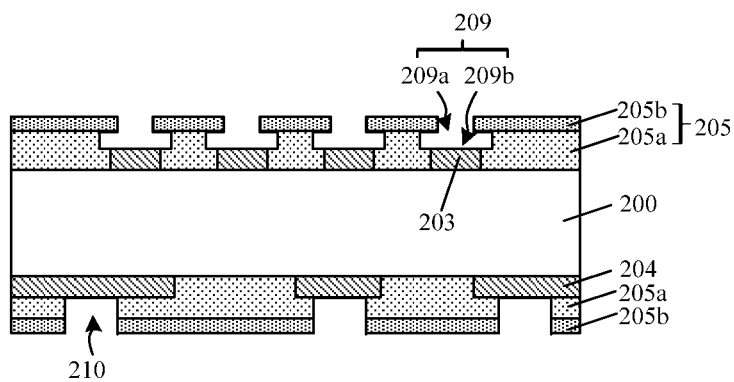

In other embodiments, referring to FIGS. 9-11, a method for forming the up-narrow and down-wide openings 209 in the first covering film 205 is further provided. The embodiment differs from the above embodiment in that: The first covering film 205 includes a first film layer 205a covering the metal pads 203 and the surface of the substrate 200 and a second film layer 205b on the first film layer 205a, a material of the first film layer 205a is different from a material of the second film layer 205b, and there is a different process for forming the up-narrow and down-wide openings 209.

Specifically, referring to FIG. 9, the first film layer 205a covering the metal pads 203 and the surface of the substrate 200 is formed. The second film layer 205b is formed on the first film layer 205a. The first film layer 205a and the second film layer 205b are formed into the first covering film 205.

The material of the second film layer 205b is different from the material of the first film layer 205a, such that the second film layer 205b and the first film layer 205a have different etch selectivities in subsequent etching to form the up-narrow and down-wide openings. The first film layer 205a may be made of silicon oxide, silicon nitride, silicon oxynitride, silicon oxycarbide, silicon carbonitride, carbon, boron-doped silicon oxide, phosphorus-doped silicon oxide, boron nitride, silicon germanide, polycrystalline silicon, amorphous silicon or amorphous carbon. The second film layer 205b may be made of silicon oxide, silicon nitride, silicon oxynitride, silicon oxycarbide, silicon carbonitride, carbon, boron-doped silicon oxide, phosphorus-doped silicon oxide, boron nitride, silicon germanide, polycrystalline silicon, amorphous silicon or amorphous carbon. The second film layer 205b and the first film layer 205a are formed by deposition. In a specific embodiment, the first film layer 205a is made of silicon oxide, and the second film layer 205b is made of silicon nitride.

Referring to FIG. 10, the second film layer 205b is etched with anisotropic dry etching to form second openings 209a in the second film layer 205b. Bottoms of the second openings 209a expose a part of the surface of the first film layer 205a.

The anisotropic dry etching includes anisotropic plasma etching.

Referring to FIG. 11, the first film layer 205a on the bottoms of the second openings 209a is etched with isotropic wet etching along the second openings 209a to form first openings 209b in the first film layer 205a. Widths of the first openings 209b are greater than widths of the second openings 209a. The first openings 209b and the second openings 209a are formed into the up-narrow and down-wide openings 209.

Figure 12:
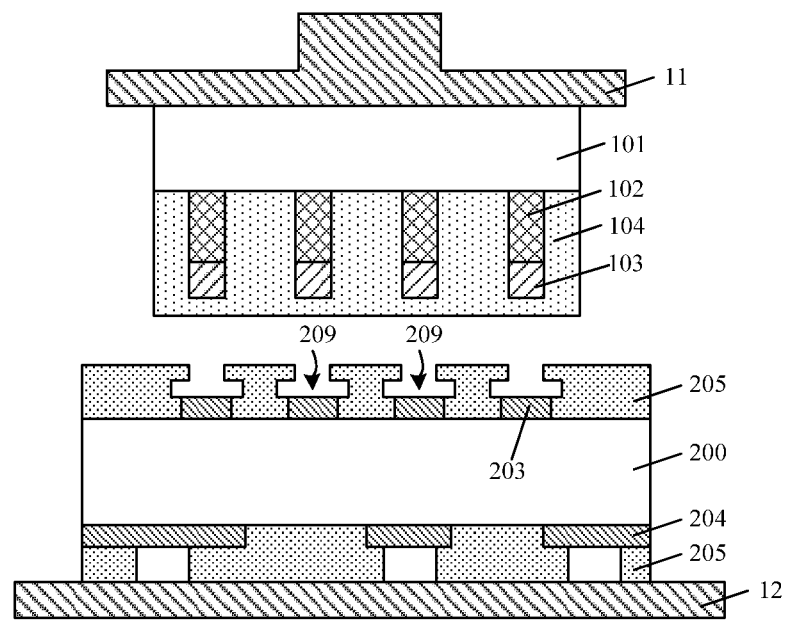
Figure 13:
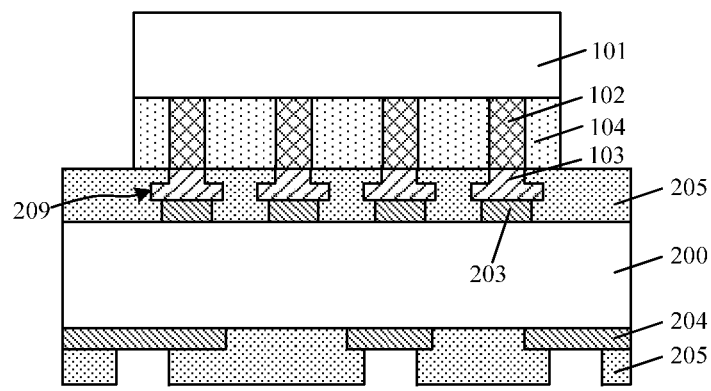

Referring to FIG. 12 and FIG. 13, the semiconductor chip 101 is flipped onto the substrate 200, such that the solder bumps 103 on the metal pillars 102 are correspondingly located in the up-narrow and down-wide openings 209 through the first covering film 205, and the solder bumps 103 fill the up-narrow and down-wide openings 209.

In some embodiments, after the semiconductor chip 101 is flipped onto the substrate 200, thermo compression bonding is employed to ensure that the solder bumps 103 on the metal pillars 102 are correspondingly located in the up-narrow and down-wide openings 209 through the first covering film 205, and the solder bumps 103 fill the up-narrow and down-wide openings 209.

In some embodiments, the thermo compression bonding includes: The semiconductor chip 101 is clamped with a clamping head 11 and first heating is performed on the semiconductor chip 101, such that the second covering film 104 is molten, and the solder bumps 103 on the metal pillars 102 are correspondingly located in the up-narrow and down-wide openings 209 through the first covering film 205. The first heating is performed at a temperature less than a melting temperature of the solder bumps 103. Second heating is performed on the semiconductor chip 101 through the clamping head 11, such that the solder bumps 103 are molten to fill the up-narrow and down-wide openings 209. A temperature of the second heating is higher than that of the first heating.

In some embodiments, the thermo compression bonding is performed at a pressure of 5-12 N for 3-5 s. The first heating is performed at the temperature of 60-70° C. The second heating is performed at the temperature of 220-250° C.

In other embodiments, there may further be a baking process and a reflow process, such that the solder bumps 103 are better molten to fill the up-narrow and down-wide openings 209 and achieve the higher bonding strength between the solder bumps 103 and the metal pads 203.

An embodiment of the present application further provides a semiconductor structure. Referring to FIG. 13, the semiconductor structure includes:

a semiconductor chip 101, a plurality of protruded metal pillars 102 and solder bumps 103 on top surfaces of the metal pillars 102 being formed on the semiconductor chip 101;

a substrate 200, a plurality of metal pads 203 being formed on a surface of the substrate 200; and a first covering film 205 located on the substrate 200 and covering the metal pads 203 and the surface of the substrate 200, a plurality of up-narrow and down-wide openings 209 being formed in the first covering film 205, and bottoms of the up-narrow and down-wide openings 209 correspondingly exposing surfaces of the metal pads 203.

The semiconductor chip 101 is flipped onto the substrate 200, such that the solder bumps 103 on the metal pillars 102 are correspondingly located in the up-narrow and down-wide openings 209, and fill the up-narrow and down-wide openings 209.

In some embodiments, the up-narrow and down-wide openings 209 each include a first opening and a second opening that communicate with each other, the second opening is located on the first opening, and a width of the second opening is smaller than a width of the first opening.

In some embodiments, the width of the second opening is ⅕-½ of the width of the first opening.

In some embodiments, the first covering film 205 is a negative photoresist film.

In some embodiments, referring to FIG. 11, the first covering film 205 includes a first film layer 205a covering the metal pads 203 and the surface of the substrate 200 and a second film layer 205b on the first film layer 205a. A material of the first film layer 205a is different from a material of the second film layer 205b. The up-narrow and down-wide openings 209 each include a second opening 209a in the second film layer 205b and a first opening 209b in the first film layer 205a. The first opening 209b communicates with the second opening 209a. The first opening 209b is wider than the second opening 209a.

In some embodiments, referring also to FIG. 13, a second covering film 104 covering the plurality of protruded metal pillars 102 is further provided between the semiconductor chip 101 and the substrate 200.

In some embodiments, the second covering film 104 is made of an NCF.

In some embodiments, the substrate 200 includes a front side and a back side opposite to the front side. The plurality of metal pads 203 are formed on the front side of the substrate 200. A plurality of external pads 204 are formed on the back side of the substrate 200.

Preferable embodiments of the present application have been described above and are not intended to limit the present application. Those skilled in the art can make possible alterations and modifications on the technical solutions of the present application with the above methods and technical contents without departing from the spirit and scope of the present application. Accordingly, any simple changes, equivalent alterations and modifications made on the embodiments according to the technical essence of the present application without departing from the contents in the technical solution of the present application shall fall within the scope of protection in the technical solutions of the present application.

The invention claimed is:

1. A method of forming a semiconductor structure, comprising:
    providing a semiconductor chip, a plurality of protruded metal pillars and a solder bump on a top surface of each of the plurality of protruded metal pillars being formed on the semiconductor chip;
    providing a substrate, a plurality of metal pads being formed on a surface of the substrate;
    forming, on the substrate, a first covering film covering the plurality of metal pads and the surface of the substrate, a plurality of up-narrow and down-wide openings being formed in the first covering film, and a bottom of each of the plurality of up-narrow and down-wide openings correspondingly exposing a surface of the plurality of metal pads; and
    flipping the semiconductor chip onto the substrate, such that the solder bump on each of the plurality of protruded metal pillars is correspondingly located in the plurality of up-narrow and down-wide openings through the first covering film, and the solder bump fills a corresponding one of the plurality of up-narrow and down-wide openings inside with an up-narrow and down-wide shape.

2. The method of forming the semiconductor structure according to claim 1, wherein the plurality of up-narrow and down-wide openings comprises a first opening and a second opening that communicate with each other, the second opening is located on the first opening, and a width of the second opening is smaller than a width of the first opening.

3. The method of forming the semiconductor structure according to claim 2, wherein the first covering film is a negative photoresist film.

4. The method of forming the semiconductor structure according to claim 3, wherein a process for forming the plurality of up-narrow and down-wide openings in the first covering film comprises: forming, on the substrate, the negative photoresist film covering the plurality of metal pads and the surface of the substrate; performing exposure on the negative photoresist film, wherein during the exposure, a part of the negative photoresist film directly over the plurality of metal pads is not exposed, a part of the negative photoresist film over a peripheral edge region of the plurality of metal pads is half exposed, and the remaining negative photoresist film is fully exposed; and developing the negative photoresist film upon the exposure, removing the unexposed negative photoresist film, and forming the plurality of up-narrow and down-wide openings in the remaining negative photoresist film.

5. The method of forming the semiconductor structure according to claim 2, wherein the first covering film comprises a first film layer covering the plurality of metal pads and the surface of the substrate and a second film layer on the first film layer, and a material of the first film layer is different from a material of the second film layer.

6. The method of forming the semiconductor structure according to claim 5, wherein a process for forming the plurality of up-narrow and down-wide openings in the first covering film comprises: forming the first film layer covering the plurality of metal pads and the surface of the substrate; forming the second film layer on the first film layer; etching the second film layer with anisotropic dry etching to form the second opening in the second film layer, a bottom of the second opening exposing a part of a surface of the first film layer; and etching, with an isotropic wet etching along the second opening, the first film layer on the bottom of the second opening to form the first opening in the first film layer, a width of the first opening being greater than a width of the second opening.

7. The method of forming the semiconductor structure according to claim 1, wherein a second covering film covering the plurality of protruded metal pillars and the solder bump on the top surface of each of the plurality of protruded metal pillars is further provided on the semiconductor chip.

8. The method of forming the semiconductor structure according to claim 7, wherein a material of the second covering film is a non-conductive film.

9. The method of forming the semiconductor structure according to claim 8, wherein after the semiconductor chip is flipped onto the substrate, a thermo compression bonding is employed to ensure that the solder bump on each of the plurality of protruded metal pillars is correspondingly located in the plurality of up-narrow and down-wide openings through the first covering film, and the solder bump fills the corresponding one of the plurality of up-narrow and down-wide openings.

10. The method of forming the semiconductor structure according to claim 9, wherein the thermo compression bonding comprises: clamping the semiconductor chip with a clamping head and performing a first heating on the semiconductor chip, such that the second covering film is molten, and the solder bump on each of the plurality of protruded metal pillars is correspondingly located in the plurality of up-narrow and down-wide openings through the first covering film; and performing a second heating on the semiconductor chip through the clamping head, such that the solder bump is molten to fill the corresponding one of the plurality of up-narrow and down-wide openings, a temperature of the second heating being greater than a temperature of the first heating.

11. The method of forming the semiconductor structure according to claim 10, wherein the thermo compression bonding is performed at a pressure of 5-12 N for 3-5 s, the first heating is performed at a temperature of 60-70° C., and the second heating is performed at a temperature of 220-250° C.

12. The method of forming the semiconductor structure according to claim 1, wherein the substrate comprises a front side and a back side opposite to the front side, the plurality of metal pads are formed on the front side of the substrate, and a plurality of external pads are formed on the back side of the substrate.

13. The method of forming the semiconductor structure according to claim 12, wherein a process for forming the plurality of metal pads and the plurality of external pads comprises: forming a metal layer on a surface of the front side and a surface of the back side of the substrate; forming a dry film on a surface of the metal layer on the front side and the back side of the substrate; exposing and developing the dry film, such that a first opening exposing a part of the surface of the metal layer on the front side of the substrate is formed in the dry film on the front side, and a second opening exposing a part of the surface of the metal layer on the back side of the substrate is formed in the dry film on the back side; and removing the exposed metal layer along the first opening and the second opening, thus forming the plurality of metal pads on the front side of the substrate and the plurality of external pads on the back side of the substrate.

14. A semiconductor structure, comprising:
a semiconductor chip, a plurality of protruded metal pillars and a solder bump on a top surface of each of the plurality of protruded metal pillars being formed on the semiconductor chip;
a substrate, a plurality of metal pads being formed on a surface of the substrate; and
a first covering film located on the substrate and covering the plurality of metal pads and the surface of the substrate, a plurality of up-narrow and down-wide openings being formed in the first covering film, and a bottom of each of the plurality of up-narrow and down-wide openings correspondingly exposing a surface of the plurality of metal pads, wherein
the semiconductor chip is flipped onto the substrate, such that the solder bump on each of the plurality of protruded metal pillars is correspondingly located in the plurality of up-narrow and down-wide openings, and fills a corresponding one of the plurality of up-narrow and down-wide openings inside with an up-narrow and down-wide shape.

15. The semiconductor structure according to claim 14, wherein the plurality of up-narrow and down-wide openings comprises a first opening and a second opening that communicate with each other, the second opening is located on the first opening, and a width of the second opening is smaller than a width of the first opening.

16. The semiconductor structure according to claim 15, wherein the width of the second opening is ⅕-½ of the width of the first opening.

17. The semiconductor structure according to claim 15, wherein the first covering film is a negative photoresist film;
wherein the first covering film comprises a first film layer covering the plurality of metal pads and the surface of the substrate and a second film layer on the first film layer, a material of the first film layer is different from a material of the second film layer, the first opening is located in the first film layer, and the second opening is located in the second film layer.

18. The semiconductor structure according to claim 14, wherein a second covering film covering the plurality of protruded metal pillars is further provided between the semiconductor chip and the substrate.

19. The semiconductor structure according to claim 18, wherein a material of the second covering film is a non-conductive film.

20. The semiconductor structure according to claim 14, wherein the substrate comprises a front side and a back side opposite to the front side, the plurality of metal pads are formed on the front side of the substrate, and a plurality of external pads are formed on the back side of the substrate.

* * * * *